(12) United States Patent
Chen et al.

(10) Patent No.: US 10,163,688 B2
(45) Date of Patent: Dec. 25, 2018

(54) INTERCONNECT STRUCTURE WITH KINKED PROFILE

(71) Applicant: Taiwan Semiconductor Manufacturing Company Limited, Hsin-Chu (TW)

(72) Inventors: Chih-Hao Chen, Hsinchu (TW); Chung-Chi Ko, Nantou (TW); Hsin-Yi Tsai, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 78 days.

(21) Appl. No.: 13/855,869

(22) Filed: Apr. 3, 2013

(65) Prior Publication Data

US 2014/0264923 A1 Sep. 18, 2014

Related U.S. Application Data

(60) Provisional application No. 61/799,662, filed on Mar. 15, 2013.

(51) Int. Cl.
*H01L 27/00* (2006.01)
*H01L 21/768* (2006.01)
(Continued)

(52) U.S. Cl.
CPC .. *H01L 21/76807* (2013.01); *H01L 21/76816* (2013.01); *H01L 23/5283* (2013.01);
(Continued)

(58) Field of Classification Search
CPC ............ H01L 23/481; H01L 21/76898; H01L 23/5226; H01L 23/53238;
(Continued)

(56) References Cited

U.S. PATENT DOCUMENTS 6,025,277 A * 2/2000 Chen ................. H01L 21/31116
257/E21.252
6,133,144 A 10/2000 Tsai et al.
(Continued)

OTHER PUBLICATIONS

"Breakdown Voltage", http://en.wikipedia.org/wiki/Breakdown_voltage, pp. 1-3, Apr. 22, 2005.

*Primary Examiner* — Dale E Page
*Assistant Examiner* — Quovaunda Jefferson
(74) *Attorney, Agent, or Firm* — Cooper Legal Group, LLC

(57) ABSTRACT

Among other things, one or more interconnect structures and techniques for forming such interconnect structures within integrated circuits are provided. An interconnect structure comprises one or more kinked structures, such as metal structures or via structures, formed according to a kinked profile. For example, the interconnect structure comprises a first kinked structure having a first tapered portion and a second kinked structure having a second tapered portion. The first tapered portion and the second tapered portion are both situated at an interface between two layers. Current leakage at the interface is mitigated because a length of the interface corresponds to a distance between the first tapered portion and the second tapered portion that is relatively larger than if the first kinked structure and the second kinked structure were merely formed according to a non-tapered shape.

20 Claims, 16 Drawing Sheets

(51) Int. Cl.
*H01L 23/528* (2006.01)
*H01L 23/532* (2006.01)

(52) U.S. Cl.
CPC .... *H01L 23/5329* (2013.01); *H01L 23/53238* (2013.01); *H01L 23/53295* (2013.01); *H01L 21/76832* (2013.01); *H01L 21/76834* (2013.01); *H01L 2924/0002* (2013.01)

(58) Field of Classification Search
CPC . H01L 2224/16225; H01L 2924/01029; H01L 21/76843; H01L 23/485; H01L 21/76816; H01L 21/76897; H01L 28/91; H01L 2225/06541; H01L 21/76831; H01L 21/02063; H01L 23/49827; H01L 23/5285; H01L 23/5329; H01L 23/53295; H01L 21/76807; H01L 21/76832; H01L 21/76834; H01L 2924/0002; H01L 2924/00
USPC ......... 257/774, 758, E23.145, E21.577, 296, 257/737, E21.579, E23.011, 773, 257/E21.585, E21.648, E21.578, E21.597, 257/E27.103, E21.582, E21.682, 316, 257/E21.019, E21.158, E23.01, 751, 257/E21.008, E23.021, E23.151, E23.152, 257/E27.088, 532, 775, E21.009, 257/E21.169, E21.495, E21.507, E21.576, 257/E21.584, E21.66, E21.664, E23.019, 257/E23.068, E23.141, E23.167, E25.013, 257/E27.016, E27.116, E29.022, E29.242, 257/E29.3, 211, 306, 314, 330, 4, 5, 618, 257/621, 778, E21.01, E21.012, E21.018, 257/E21.175, E21.179, E21.214, E21.219, 257/E21.25, E21.251, E21.29; 438/637, 438/667, 675, 3, 640, 396, 643, 652, 701, 438/253, 381, 382, 589, 613, 618, 629, 438/648, 666, 700, 107, 128, 151, 22, 438/238, 239, 24, 240, 259, 270, 28, 288, 438/296, 424, 427, 433, 434, 597, 622, 438/627, 638, 653, 673, 687, 689, 702, 438/73
See application file for complete search history.

(56) References Cited

U.S. PATENT DOCUMENTS

| | | |
|---|---|---|
| 6,440,847 B1 | 8/2002 | Lou |
| 6,472,721 B2 | 10/2002 | Ma et al. |
| 8,034,722 B2 | 10/2011 | Lin et al. |
| 2004/0195652 A1* | 10/2004 | Okada ........................ 257/531 |
| 2008/0171442 A1* | 7/2008 | Wu et al. ..................... 438/702 |
| 2012/0008295 A1* | 1/2012 | Ouchi et al. ................. 361/783 |

* cited by examiner

INTERCONNECT STRUCTURE WITH KINKED PROFILE

BACKGROUND

As semiconductor technology advances into the nanometer realm, such as 45 nm and below, various fabrication challenges arise. For example, breakdown voltage (VBD) and time dependent dielectric breakdown (TDDB) can be affected by relatively smaller dielectric spacing, relatively smaller interconnect pitch sizing, and other design factors resulting from sizing constraints of integrated circuits. VBD corresponds to a maximum voltage difference that can be applied to a dielectric material before the dielectric material collapses and conducts, which can lead to permanent physical or molecular changes to the dielectric material, such as a weakened path through the dielectric material. TDDB corresponds to a breakdown of MOSFETs that results from a formation of a conducting path through gate oxide to a substrate due to electron tunneling when the MOSFET is operating close to or beyond a specified operating voltage. In another example, current leakage can occur at an interface between two layers, such as between a dielectric layer and another layer. Such current leakage can increase as the length of the interface decreases. For example, an interface between a dielectric layer and an etch stop layer can be relatively small because the interface is bound between two structures, such as metal lines or vias, formed within the dielectric layer.

DETAILED DESCRIPTION

Figure 1:
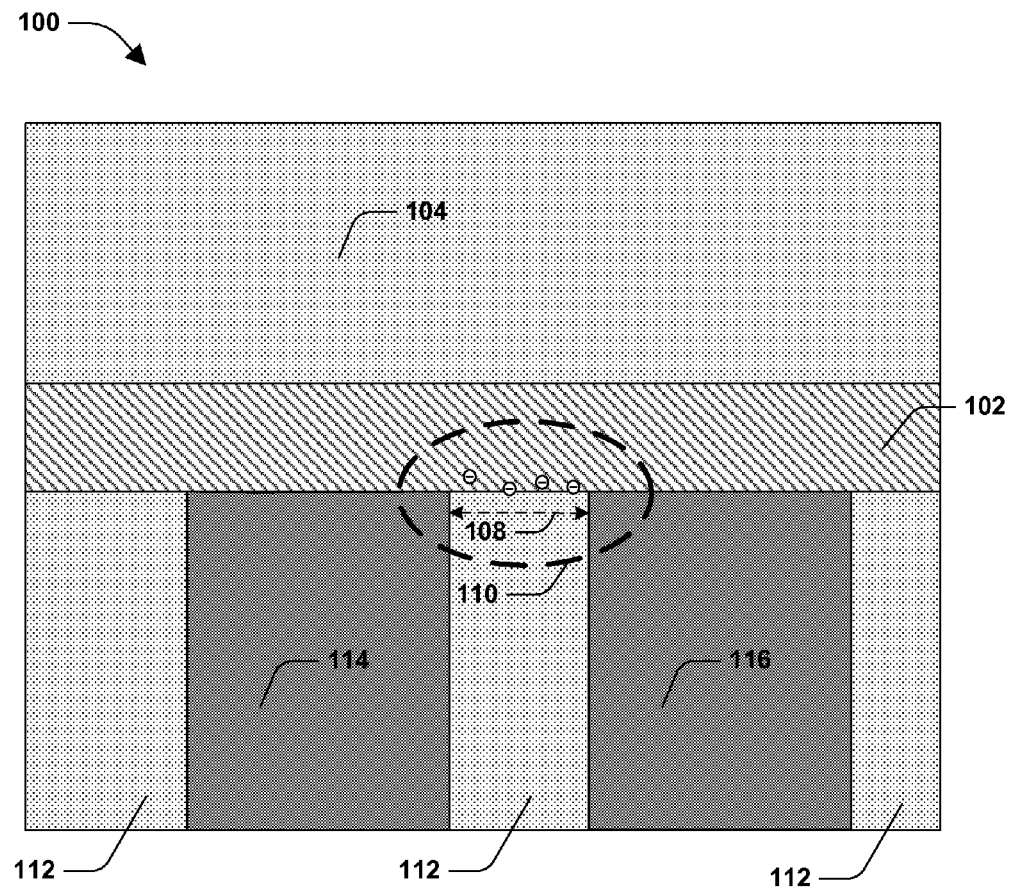
FIG. 1 is an illustration of an example of current leakage at an interface between a dielectric layer and a second layer.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1 illustrates an example 100 of current leakage at an interface 110 between a dielectric layer 112 and a second layer 102 overlying the dielectric layer 112 of an integrated circuit. A first conductive structure 114 and a second conductive structure 116, such as metal lines or vias, are formed within the dielectric layer 112. The second layer 102, such as an etch stop layer, may be formed over the dielectric layer 112. In an example, a second dielectric layer 104 is formed over the second layer 102. The interface 110 between the dielectric layer 112 and the second layer 102 has a length corresponding to a distance 108 between the first conductive structure 114 and the second conductive structure 116. Because the length is relatively short, current leakage can occur between the first conductive structure 114 and the second conductive structure 116, particularly at the interface 110, which can degrade performance of the integrated circuit. It will be appreciated that current leakage between the first conductive structure 114 and the second conductive structure 116 is more prone to occur at the interface 110, rather than within the dielectric layer 112 below the interface, due to intrinsic properties of the materials at the interface which allow more defect sources to accumulate at the interface, as compared to other areas between the first conductive structure 114 and the second conductive structure 116.

Figure 2A:
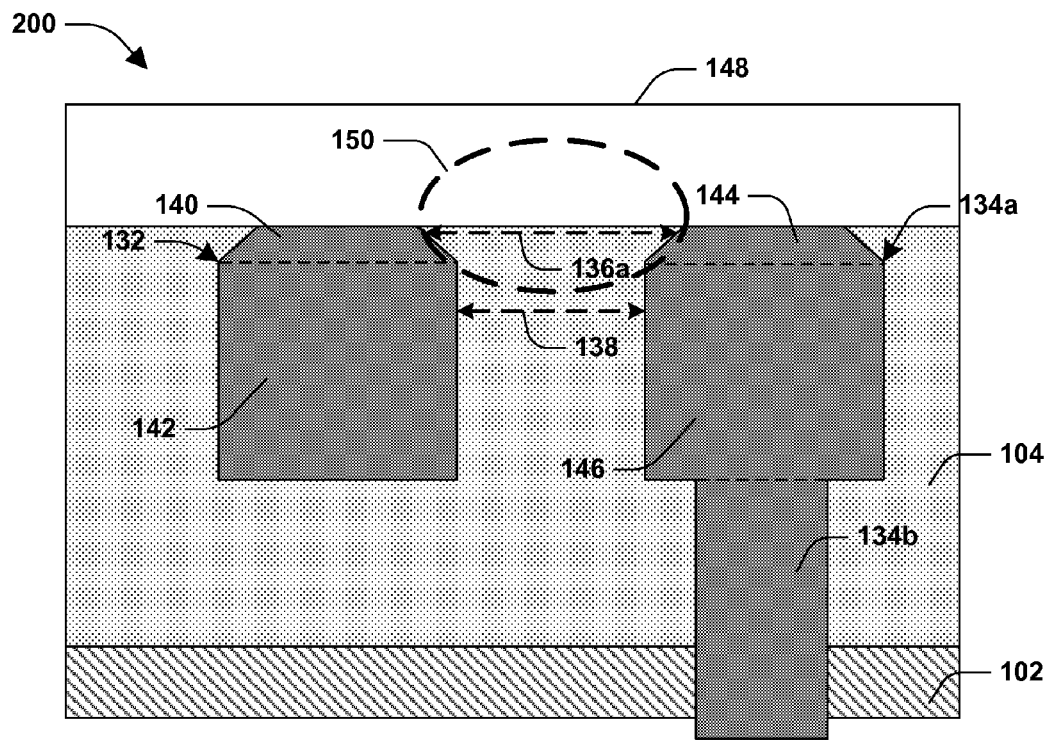
FIG. 2A is an illustration of an interconnect structure comprising a first kinked structure and a second kinked structure, according to some embodiments.

FIG. 2A illustrates an example 200 of a first kinked structure 132, a second kinked structure 134a, and a via structure 134b formed within a dielectric layer 104 of an integrated circuit. In some embodiments, the dielectric layer 104 is formed over an etch stop layer 102. In an example, the first kinked structure 132 is a first metal line, the second kinked structure 134a is a second metal line, and the via structure 134b connects the second kinked structure 134a to a lower layer. In some embodiments, the first kinked structure 132, the second kinked structure 134a, and the via structure 134b are formed using a dual damascene process. For example, in a "via first" dual damascene process, a via opening is initially patterned in the dielectric layer 104 and the etch stop layer 102 for the via structure 134b, and then trench openings are patterned in an upper portion of the dielectric layer 104 for the first kinked structure 132 and the second kinked structure 134a. Alternatively, in a "trench first" dual damascene process, trench openings are initially patterned in the upper portion of the dielectric layer 104 for the first kinked structure 132 and the second kinked structure 134a, and then a via opening for the via structure 134b is formed in the dielectric layer 104 and the etch stop layer 102. Regardless of whether a "via first", "trench first" or other type of process is used, a conductive material, such as copper, is filled into the via opening and the trench openings to form the first kinked structure 132, the second kinked structure 134a, and the via structure 134b.

The first kinked structure 132, such as a first metal line within the integrated circuit, comprises a first neck portion 140 and a first body portion 142. The first neck portion 140 has a first neck width that is less than a first body width of the first body portion 142. The first neck portion 140 comprises a first tapered portion situated at an interface 150 between the dielectric layer 104 and a layer 148 overlying the dielectric layer 104. In some embodiments the first tapered portion situated at the interface 150 is between about 0.50 to about 0.95 times less wide than the first body width. The second kinked structure 134a comprises a second neck portion 144 and a second body portion 146. The second neck portion 144 has a second neck width that is less than a second body width of the second body portion 146. The second neck portion 144 has a second tapered portion situated at the interface 150 between the dielectric layer and the layer 148. In some embodiments the second tapered portion situated at the interface 150 is between about 0.50 to about 0.95 times less wide than the second body width. In some embodiments, the first kinked structure 132 and/or the second kinked structure 134a have more of a vase-like shape, and thus do not have the first neck portion 140 and/or the second neck portion 144. In such embodiments a length of the interface 150 is nevertheless increased, as described below, because a top of the vase at the interface 150 is narrower than a portion of the vase below the interface 150.

A length of the interface 150 corresponds to a first distance 136a between the first neck portion 140 and the second neck portion 144. It will be appreciated that the first distance 136a is larger than a second distance 138 between the first body portion 142 and the second body portion 146, due to the first tapered portion of the first neck portion 140 and the second tapered portion of the second neck portion 144. That is, the length of the interface 150 is increased relatively to the interface 110 of FIG. 1 because the first kinked structure 132 and the second kinked structure 134a have a tapered shape relatively close to the interface 150 as opposed to having a non-tapered shape. In some embodiments, the first distance 136a is between about 1.05 to about 1.50 times greater than the second distance 138. It will be appreciated that increasing the first distance 136a mitigates mitigate current leakage at the interface 150 between the first kinked structure 132 and the second kinked structure 134a, where mitigating such current leakage can improve breakdown voltage (VBD) and time dependent dielectric breakdown (TDDB) associated with the integrated circuit.

Figure 2B:
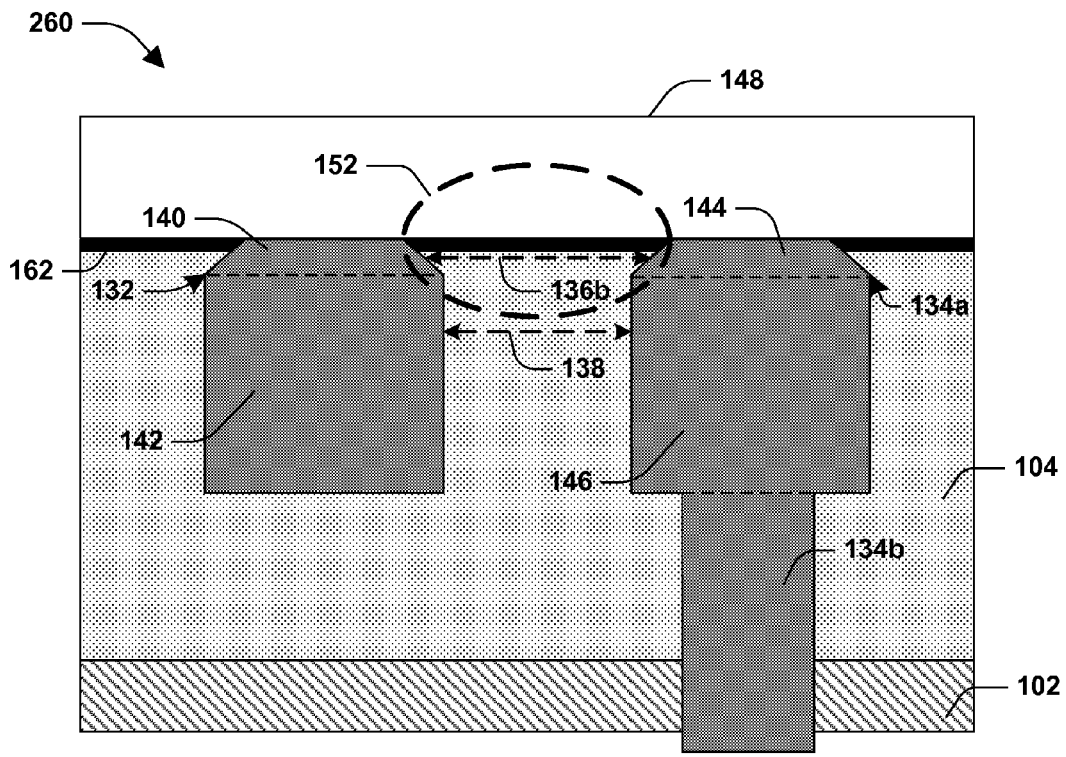
FIG. 2B is an illustration of an interconnect structure comprising a first kinked structure and a second kinked structure, according to some embodiments.

In some embodiments, the integrated circuit comprises a cap layer 162 formed over the dielectric layer 104, such as between the dielectric layer 104 and the layer 148, as illustrated by example 260 of FIG. 2B. In some embodiments, the cap layer 162 facilitates forming the first kinked structure 132 and the second kinked structure 134a by having a different etch selectivity relative to the dielectric layer 104, as discussed below. In some embodiments, the cap layer 162 serves to retain the first neck portion 140 and the second neck portion 144 during a chemical mechanical polishing (CMP) process. For example, CMP is used to remove excess conductive material, such as copper, used to form the via structure 134b, the first kinked structure 132, and the second kinked structure 134a. In some embodiments, the entire cap layer is removed during CMP, as illustrated in example 200 of FIG. 2A. In some embodiments, merely a portion of the cap layer is removed during CMP, resulting in the cap layer 162, as illustrated in example 260 of FIG. 2B. Regardless, the presence of the cap layer 162 preserves the first neck portion 140 and the second neck portion 144 that would otherwise be polished away during CMP in the absence of the cap layer 162.

It is to be appreciated that the scope of the instant application is not limited to the illustrated embodiments. For example, the length of an interface between two structures can correspond to a distance between a metal structure and a via structure such as a via induced metal bridge, a first via structure and a second via structure, a first metal structure and a second metal structure, etc., and that merely two metal structures are illustrated for simplicity. In some embodiments, a first via structure and a second via structure are formed within a dielectric layer. The first via structure is formed adjacent to the second via structure within the dielectric layer. The first via structure has a first neck portion having a tapered shape and a first body portion having a non-tapered shape. The second via structure has a second neck portion having a tapered shape and a second body portion having a non-tapered shape. The first neck portion and the second neck portion are situated at an interface between the dielectric layer and a second layer overlaying the dielectric layer. A length of the interface corresponds to a first distance between the first neck portion and the second neck portion that is relatively larger than a second distance between the first body portion and the second body portion. Current leakage at the interface is mitigated because the length of the interface is relatively longer than if the first neck portion and the second neck portion were merely formed according to the non-tapered shape. It will be appreciated that the first kinked structure 132 and the second kinked structure 134a are, at times, collectively referred to as an interconnect structure because they serve to electrically couple features in the same layer or in different layers. Again, however, the instant application is not to be so limited. For example, one or more of the first kinked structure 132 or the second kinked structure 134a correspond to a via structure in some embodiments.

Figure 3:
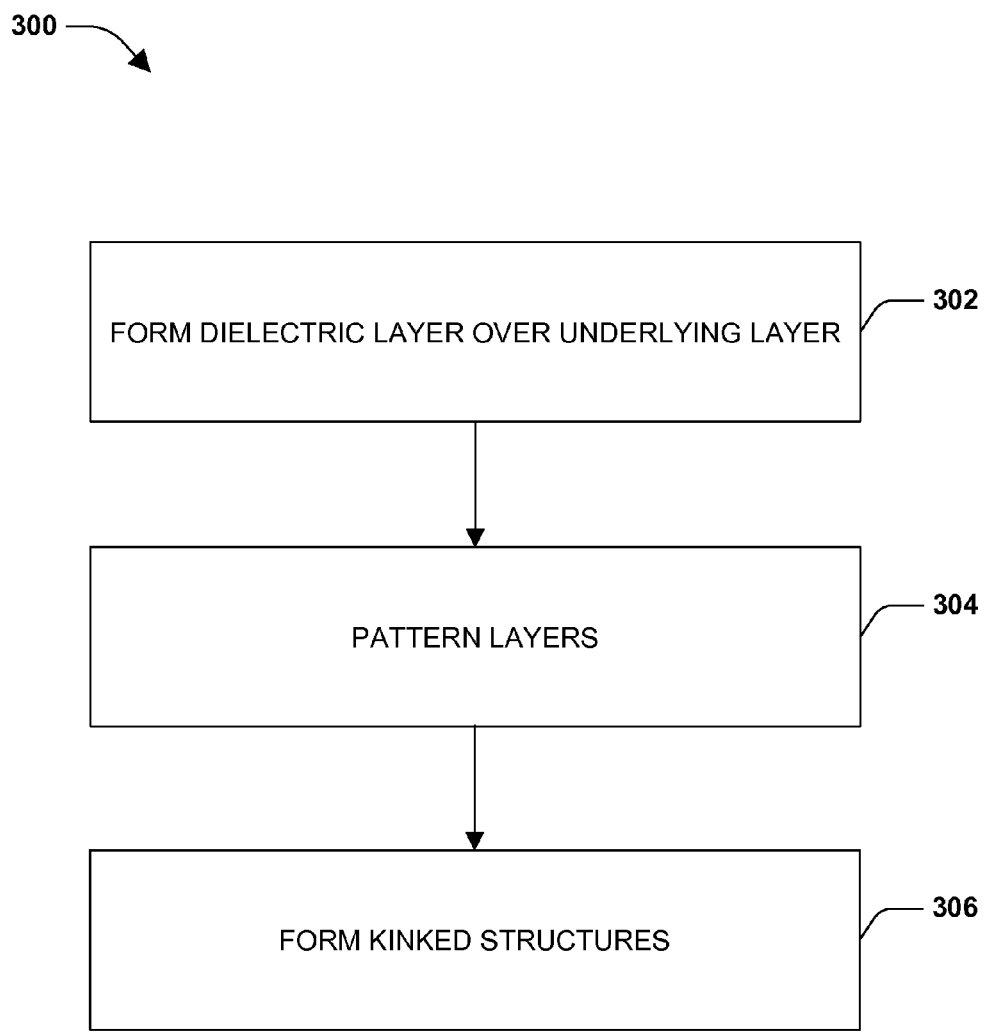
FIG. 3 is a flow diagram illustrating a method of forming an interconnect structure having a kinked profile, according to some embodiments.

A method 300 of forming an interconnect structure having a kinked profile, according to some embodiments, is illustrated in FIG. 3, and one or more associated structures formed by such a methodology are illustrated in FIGS. 4A-6B. In some embodiments, the interconnect structure is formed for technology nodes of 45 nm or smaller. In some embodiments, an etch stop layer 102 is formed over a substrate 402, as illustrated in example 400 of FIG. 4A. In an example, the etch stop layer 102 is formed to a thickness t1 between about 30 A to about 500 A. In some embodiments, the etch stop layer 102 comprises silicon oxide, silicon nitride, or silicon carbide. In some embodiments, the substrate comprises a silicon or oxide material.

At 302, a dielectric layer 104 is formed over an underlying layer of the integrated circuit. For example, the dielectric layer 104 is formed over the etch stop layer 102, as illustrated in example 410 of FIG. 4B. In some embodiments, the dielectric layer 104 has a low dielectric constant (k value), such as a value of about 3.8 or below. In some embodiments, the dielectric layer 104 layer has a k value of about 3.0 or below. In some embodiments, the dielectric layer 104 has a k value of about 2.5 or below. The dielectric layer 104 is, in some embodiments, further characterized or classified as ultra low-K (ULK), extra low-K (ELK), or extreme low-k (XLK), where the classification is generally based upon the k value. For example, ULK generally refers to materials with a k value of between about 2.7 to about 2.4, ELK generally refers to materials with a k value of between about 2.3 to about 2.0, and XLK generally refers to materials with a k value of less than about 2.0. In some embodiments, the dielectric layer 104 comprises carbon, hydrogen, oxygen, or combinations thereof. By way of further example, and not limitation, the dielectric layer 104 comprises spin-on glass (SOG), fluorinated silica glass (FSG), organosilicate glass, porogen-containing material(s), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric material(s), other suitable dielectric material(s), or combinations thereof. In some embodiments, the dielectric layer 104 comprises one or more dopants. As with other structures, features, elements, layers, etc. provided herein, the dielectric layer 104 is formed by any suitable process, such as spin-on coating, chemical vapor deposition (CVD), atomic layer deposition (ALD), high density plasma CVD (HPCVD), low pressure CVD (LPCVD), metal organic CVD (MOCVD), remote plasma CVD (RPCVD), plasma enhanced CVD (PECVD), high density plasma (HDP) process, high aspect ratio process (HARP), or other suitable processes, or combinations thereof. It is understood that, in some embodiments, the dielectric layer 104 comprises one or more dielectric materials and additionally or alternatively one or more dielectric layers. In some embodiments, the dielectric layer 104 is formed to a thickness t2 between about 300 A to about 5,000 A.

Figure 4A:
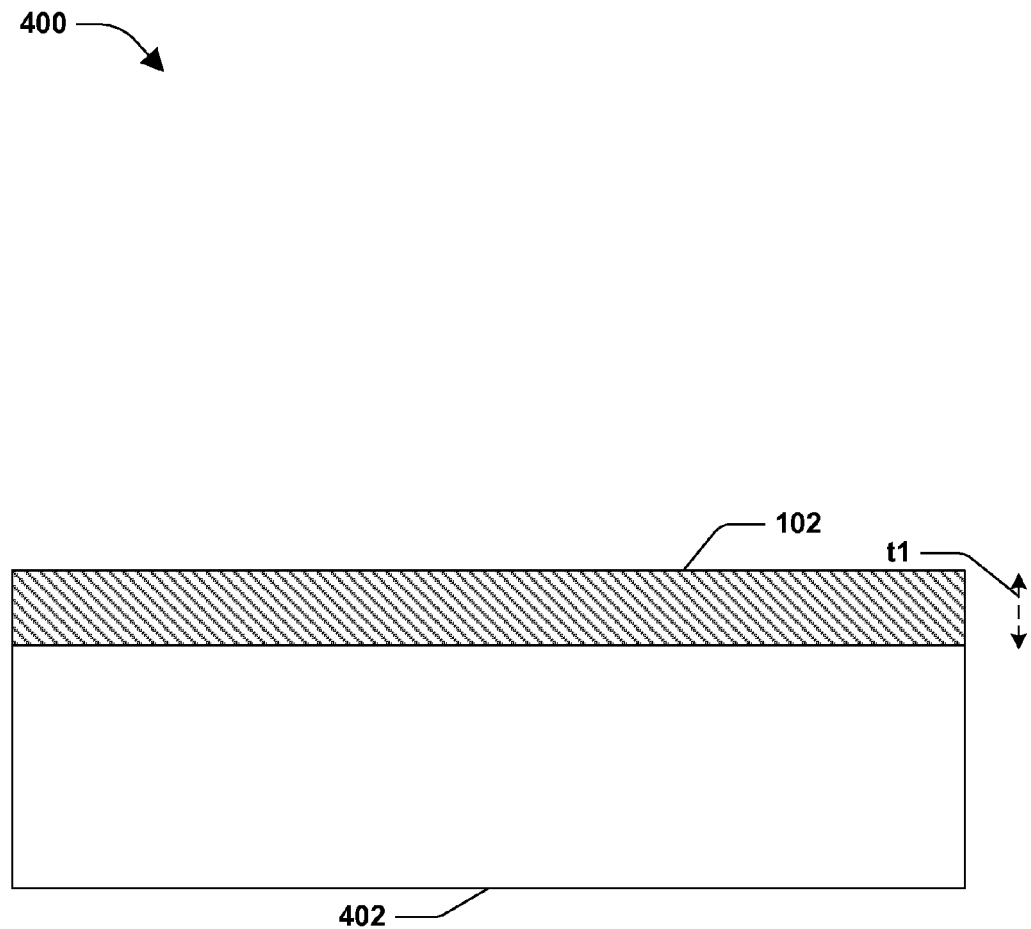
FIG. 4A is an illustration of an etch stop layer at an intermediate fabrication stage of an interconnect structure, according to some embodiments.
Figure 4B:
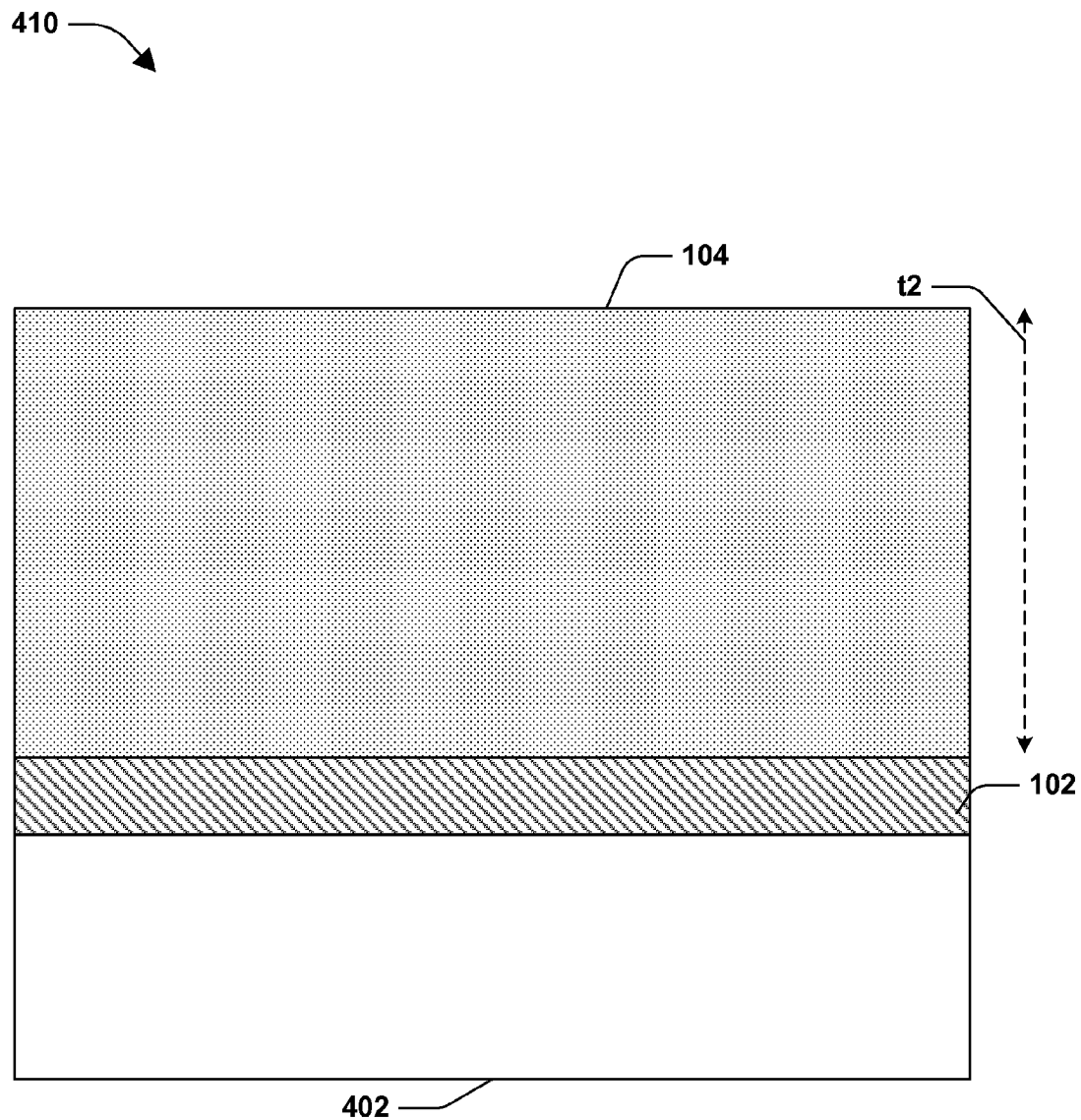
FIG. 4B is an illustration of a dielectric layer at an intermediate fabrication stage of an interconnect structure, according to some embodiments.
Figure 4C:
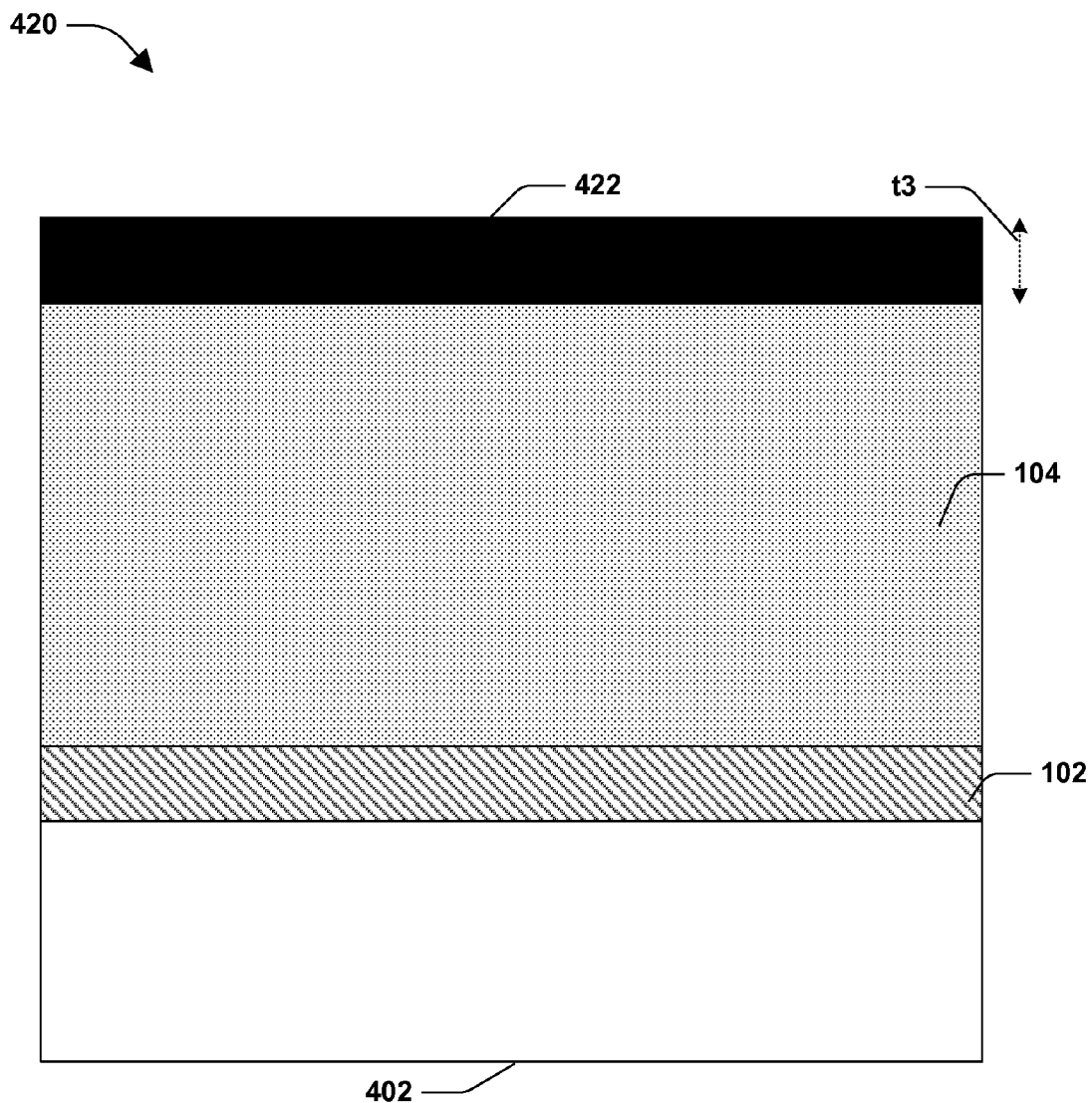
FIG. 4C is an illustration of a cap layer at an intermediate fabrication stage of an interconnect structure, according to some embodiments.

In some embodiments, a cap layer 422 is formed over the dielectric layer 104, as illustrated in example 420 of FIG. 4C. In some embodiments, the cap layer 422 serves to preserve one or more neck portions 140, 144 of kinked structures 132, 134a and/or facilitates forming such kinked structures. In some embodiments, the cap layer 422 comprises SiC, SiOC, SIN, SiCN, $SiO_2$, BN, amorphous Si, or C. In some embodiments, the cap layer 422 is formed to a thickness t3 between about 200 A to about 1,000 A.

Figure 4D:
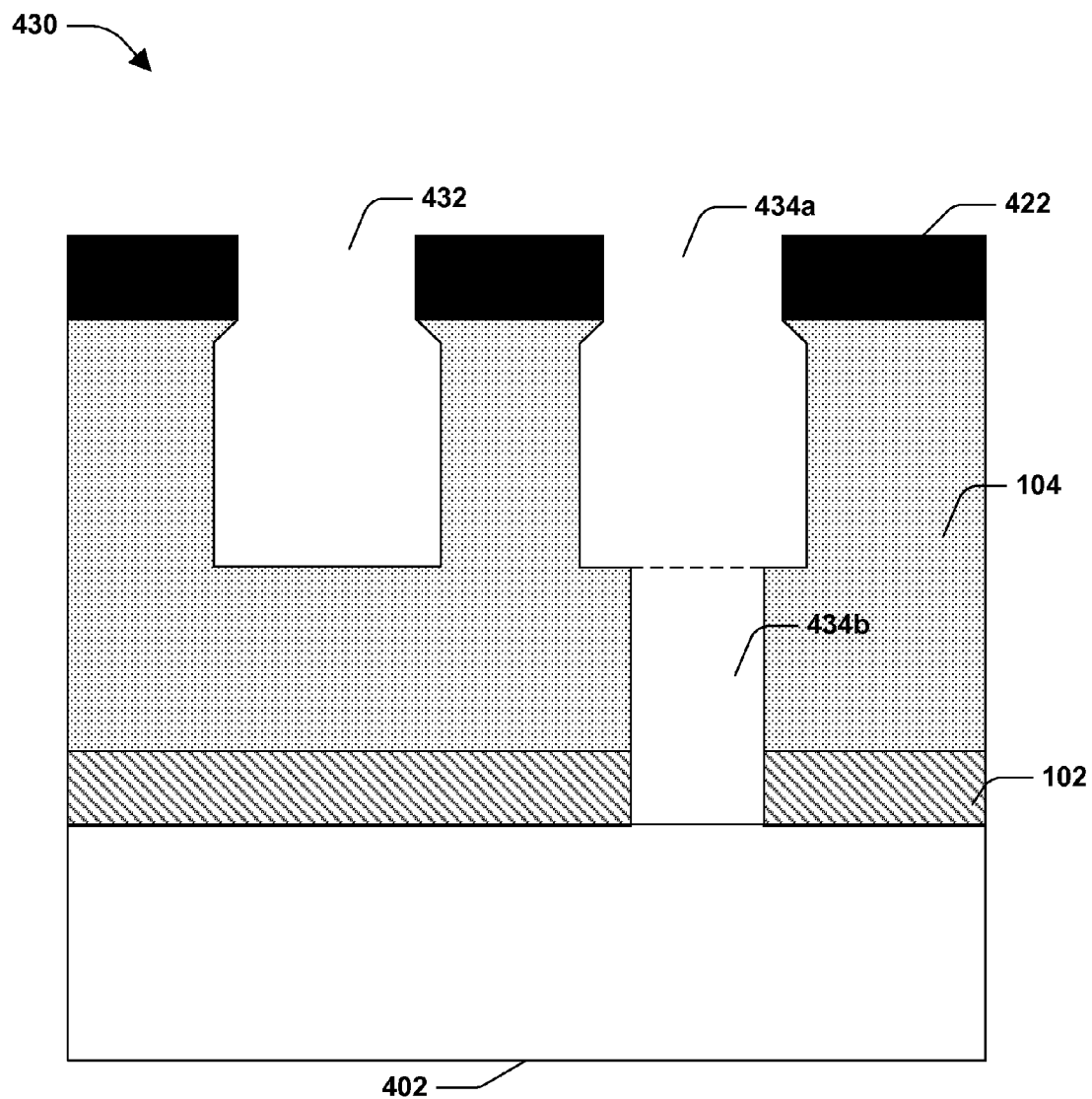
FIG. 4D is an illustration of one or more openings formed during an intermediate fabrication stage of an interconnect structure, according to some embodiments.
Figure 4E:
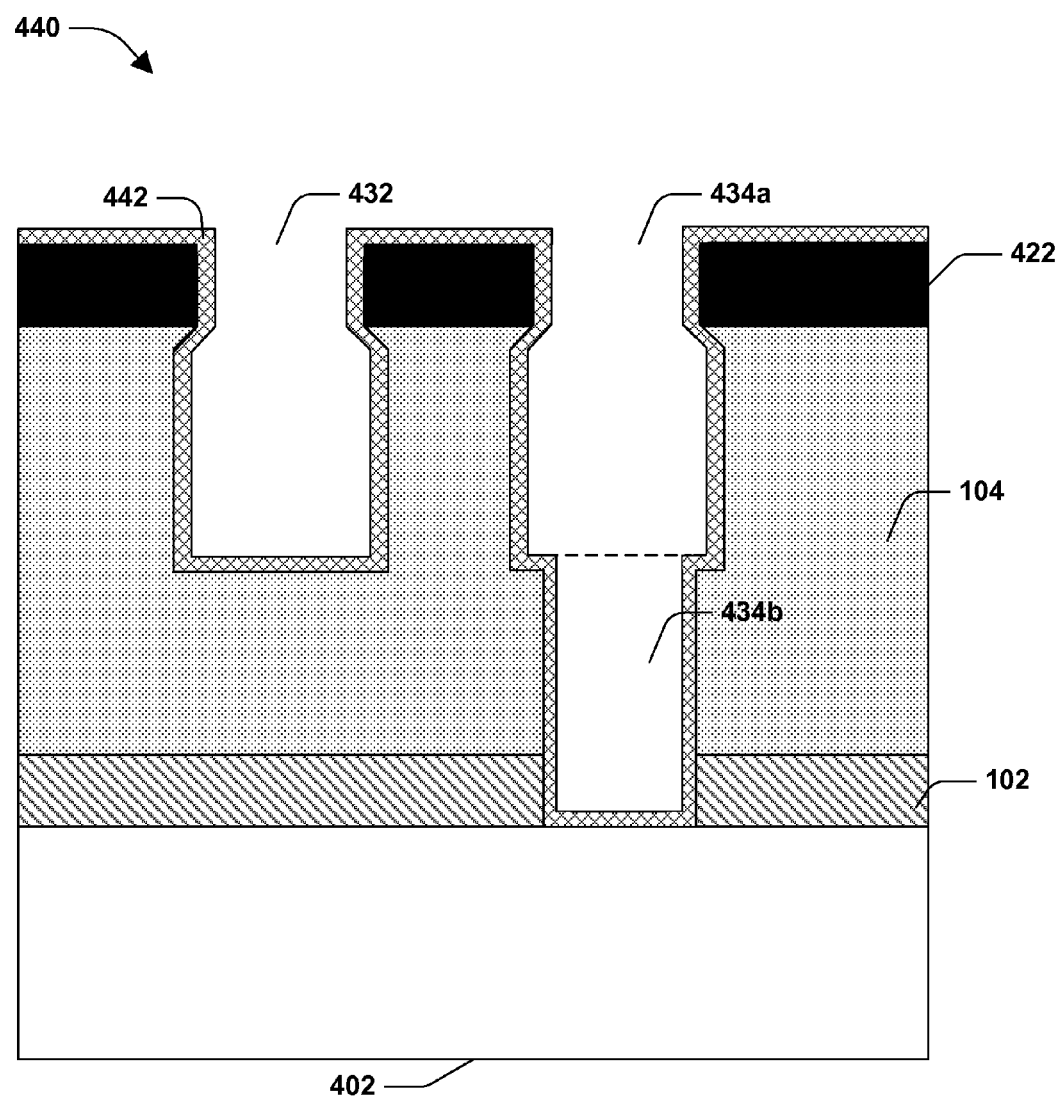
FIG. 4E is an illustration of a barrier layer at an intermediate fabrication stage of an interconnect structure, according to some embodiments.
Figure 4F:
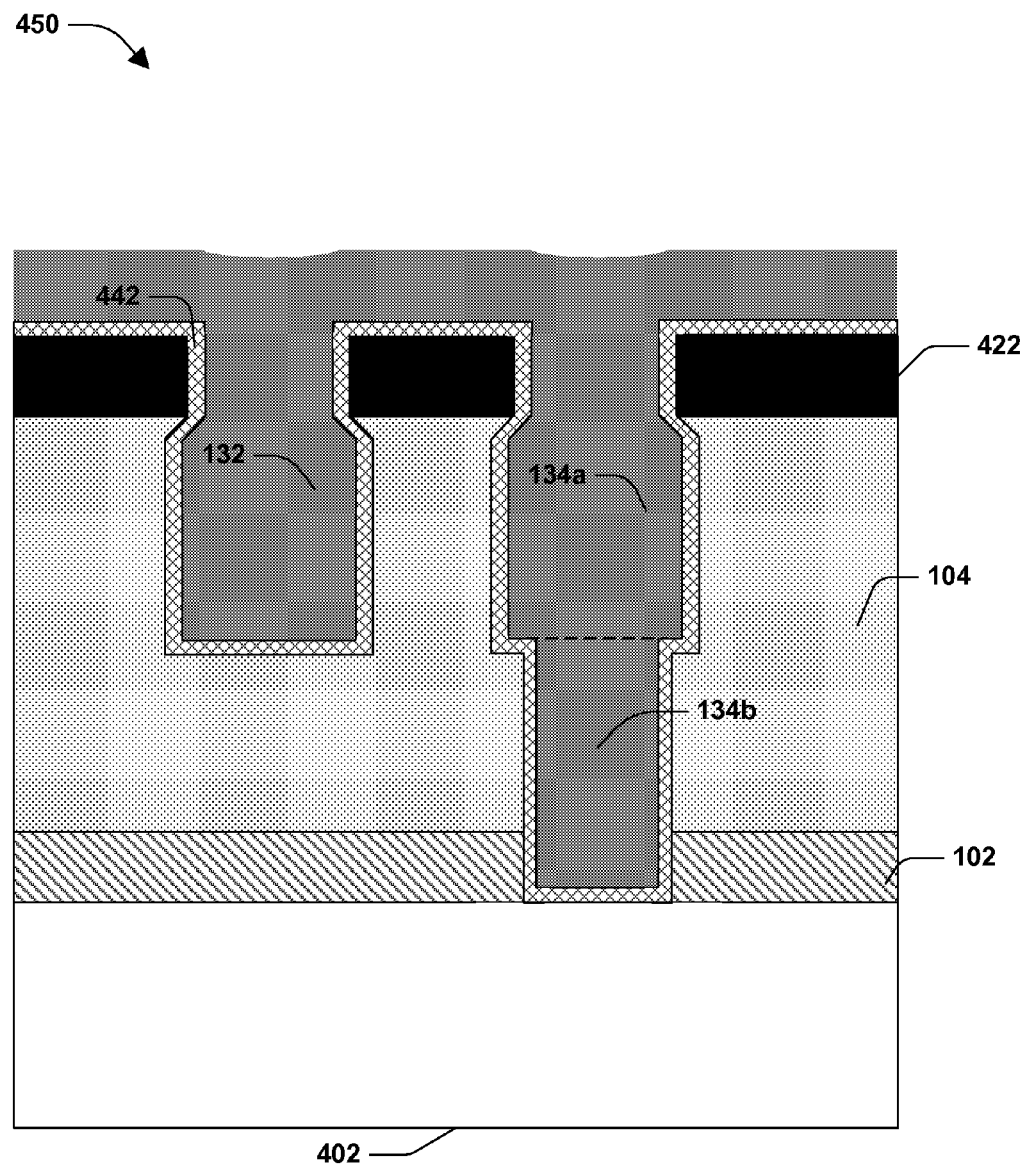
FIG. 4F is an illustration of one or more kinked structures of an interconnect structure, according to some embodiments.
Figure 4G:
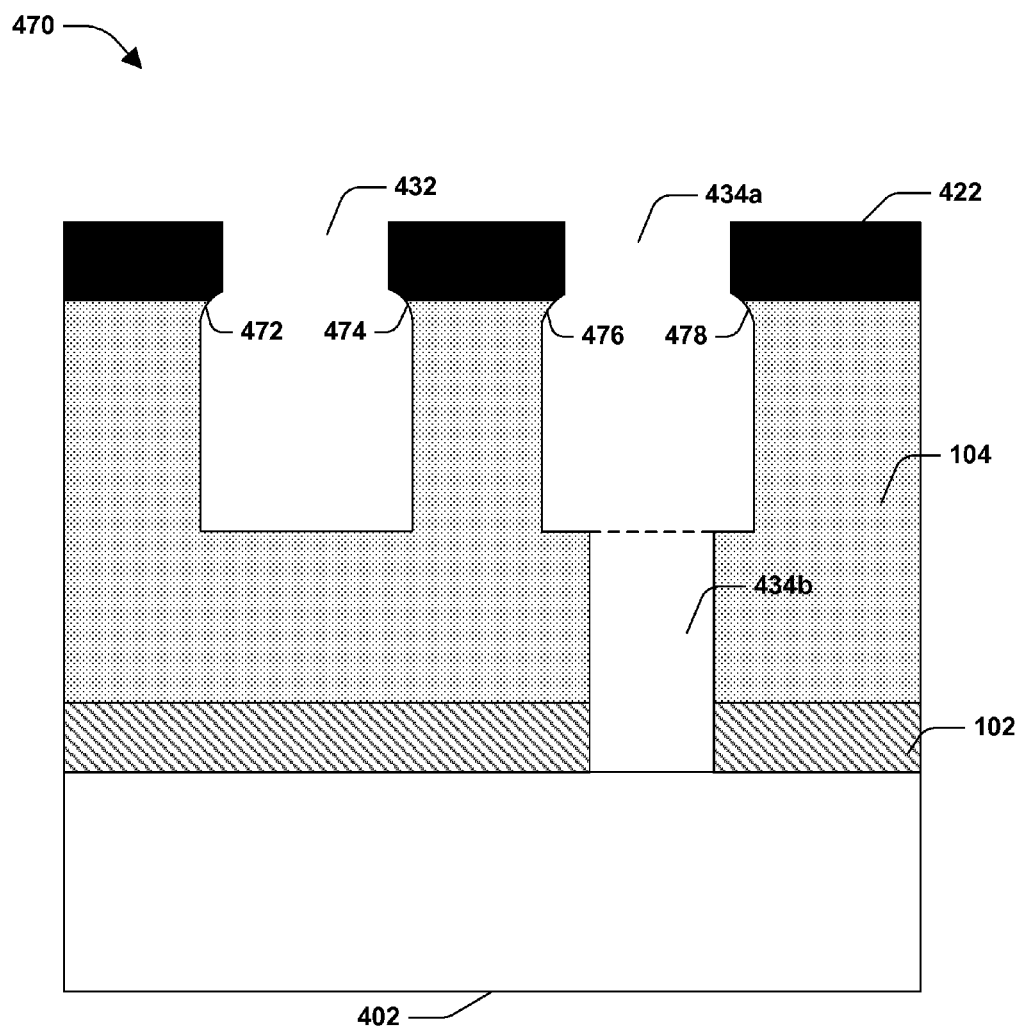
FIG. 4G is an illustration of one or more openings formed during an intermediate fabrication stage of an interconnect structure, according to some embodiments.

At 304, the cap layer 422, the dielectric layer 104, and the etch stop layer 102 are patterned, as illustrated by example 430 of FIG. 4D and example 470 of FIG. 4G, such as by using photolithographic techniques or etching processes, such as a wet etching process, for example. In some embodiments, one or more trench openings and/or one or more via openings are formed according to a damascene or a dual-damascene process. In an example, a first trench opening 432, within which the first kinked structure 132 is to be formed, is etched into the dielectric layer 104, and a second trench opening 434a, within which the second kinked structure 134a is to be formed, is etched into the dielectric layer 104. A via opening 434b, within which the via structure 134b is to be formed, is etched into the dielectric layer 104 and the etch stop layer 102. A "via first" approach can be used to form via openings before trench openings, or a "trench first" approach can be used to form trench openings before via openings. In some embodiments, the first trench opening 432 has a first trench tapered portion. In an example, the first trench tapered portion has a first rounded shoulder portion 472 and a second rounded shoulder portion 474, as illustrated in example 470 of FIG. 4G. In some embodiments, the second trench opening 434a has a second trench tapered portion. In an example, the second trench tapered portion has a third rounded shoulder portion 476 and a fourth rounded shoulder portion 478, as illustrated in example 470 of FIG. 4G. It is appreciated that the first trench tapered portion and the second trench tapered portion can have the rounded shape, as illustrated in example 470 of FIG. 4G, or can have other shapes or configurations, such as an angular shape, as illustrated in example 430 of FIG. 4D.

In some embodiments, one or more etching processes, such as a wet etching process or a relatively isotropic etching process, that utilize one or more of $CF_4$, $O_2$, Ar, or other etching chemistries are used to form the trench openings and the via opening. In some embodiments of a wet etching process, a wet etch solution comprising $H_2O_2$, $HNO_3$, or HCL is used to remove at least a portion of the cap layer 422 to control a tapered shape of the first trench opening 432 or other trench openings. It will be appreciated that by controlling one or more variables such as temperature, pressure, or etch chemistries, for example, the kinked profiles etched into the dielectric layer 104 are achieved. For example, a particular etching process will have a different etch selectivity for the cap layer 422 as compared to the dielectric layer 104. For example, the cap layer 422 is etched at a first rate and the dielectric layer 104 is etched at a second rate, where the second rate is greater than the first rate, in some embodiments. Accordingly, once the cap layer 422 is etched through and the dielectric layer 104 is etched, the second rate is sufficiently faster than the first rate so as to achieve the kinked profiles in the dielectric layer 104. That is, more material is removed from the dielectric layer 104 than is removed from the cap layer 422 per unit time. In some embodiments, the etching process is performed for between about 10 seconds to about 1 minute. In some embodiments, a temperature associated with the etching process is increased once the cap layer 422 is etched through to increase the rate at which the dielectric layer 104 is etched relative to the cap layer 422. In some embodiments, a concentration of etchants associated with the etching process is increased once the cap layer 422 is etched through to increase the rate at which the dielectric layer 104 is etched relative to the cap layer 422. For example, a concentration of one or more of $CF_4$ or $O_2$, is increased once the cap layer 422 is etched through to increase the rate at which the dielectric layer 104 is etched relative to the cap layer 422.

In some embodiments, a barrier layer 442 is formed, as illustrated by example 440 of FIG. 4E. For example, the barrier layer 442 is formed over the cap layer 422, and lines the one or more openings. The barrier layer 442 generally serves to mitigate migration of copper atoms into the dielectric layer 104 and serves to adhere the kinked structures to the dielectric layer 104. In some embodiments, the barrier layer 442 is formed by ALD or a physical vapor deposition (PVD) process.

Conductive material, such as copper, is formed within the first trench opening 432, the second trench opening 434a, and the via opening 434b, as illustrated in example 450 of FIG. 4F. At 306, the first kinked structure 132, the second kinked structure, and the via structure 134b are formed from the conductive material. In an example, conductive material is formed within the first trench opening 432 to create the first kinked structure 132. The conductive material is formed within the via opening 434b to create the via structure 134b. The conductive material is formed within the second trench opening 434a to create the second kinked structure 134a. In some embodiments, a copper plating technique is used to form cooper as the conductive material based upon a relatively thin cooper seed formed on the barrier layer 442. In some embodiments the copper seed is formed by PVD, and the copper is formed by electroplating. In some embodiments, the conductive material is formed over the cap layer 422.

Figure 5A:
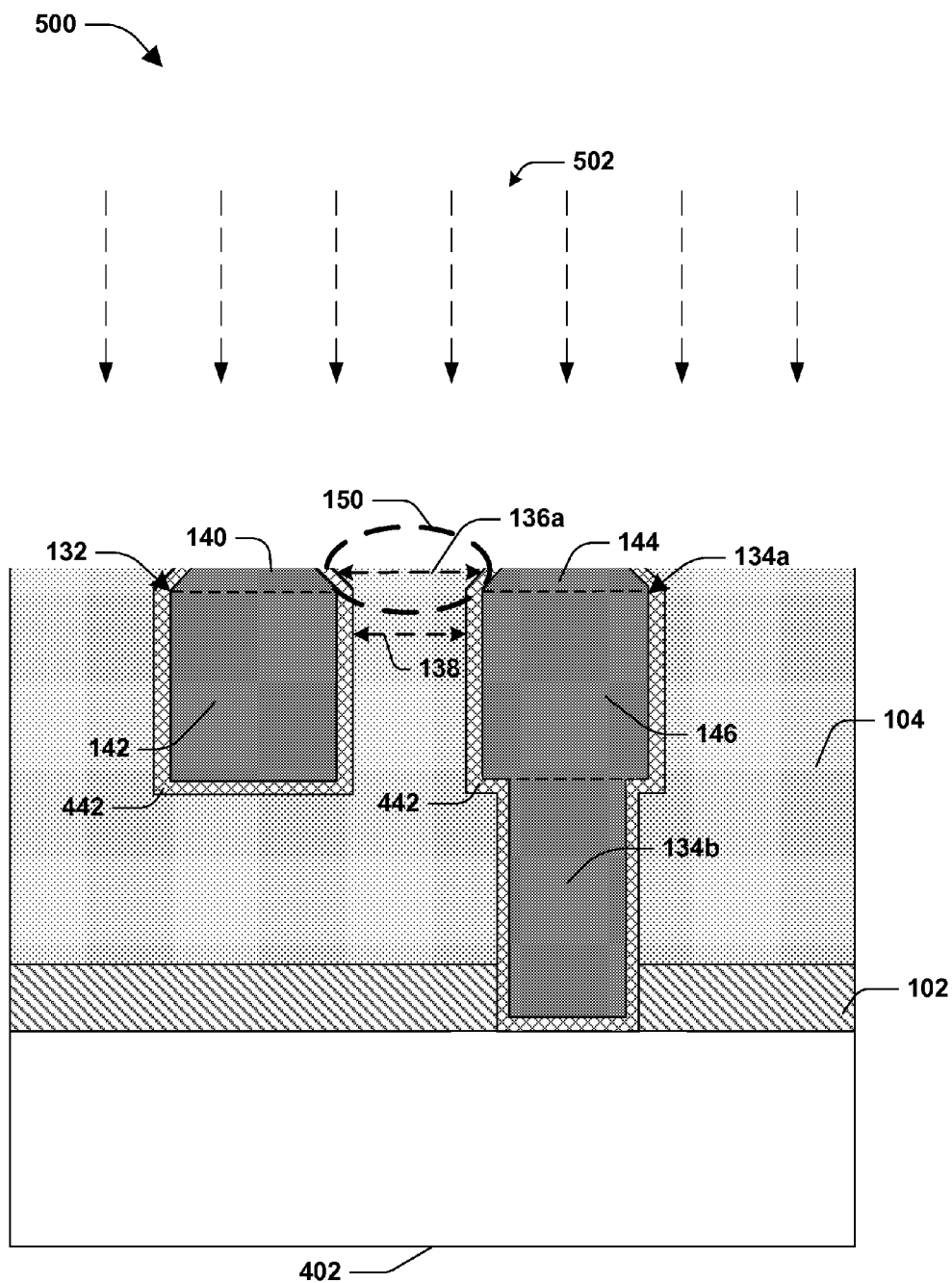
FIG. 5A is an illustration of one or more kinked structures of an interconnect structure, according to some embodiments.

In some embodiments, a CMP process 502 is performed to remove the conductive material formed over the cap layer 422, resulting in removal of the entire cap layer 422, as illustrated in example 500 of FIG. 5A. In this way, the first kinked structure 132 and the second kinked structure 134a are formed according to a kinked profile. For example, the first kinked structure 132 comprises a first neck portion 140 that comprises a first tapered portion situated at an interface 150 between the dielectric layer 104 and a layer formed over the dielectric layer 104, not illustrated. The first kinked structure 132 comprises a first body portion 142 having a first body width that is larger than a first neck width of the first neck portion 140. The second kinked structure 134a comprises a second neck portion 144 that comprises a second tapered portion situated at the interface 150. The second kinked structure 134a comprises a second body portion 146 having a second body width that is larger than a second neck width of the second neck portion 144. Because of the tapered shape of the first tapered portion and the second tapered portion, a length of the interface 150 is relatively longer than if the first kinked structure 132 and the second kinked structure 134a were not formed with the tapered portions but were merely formed with a substantially vertical profile similar to the body portions. That is, the length of the interface 150 corresponds to first distance 136a between the first neck portion 140 and the second neck portion 144, which is larger than a second distance 138 between the first body portion 142 and the second body portion 146.

Figure 5B:
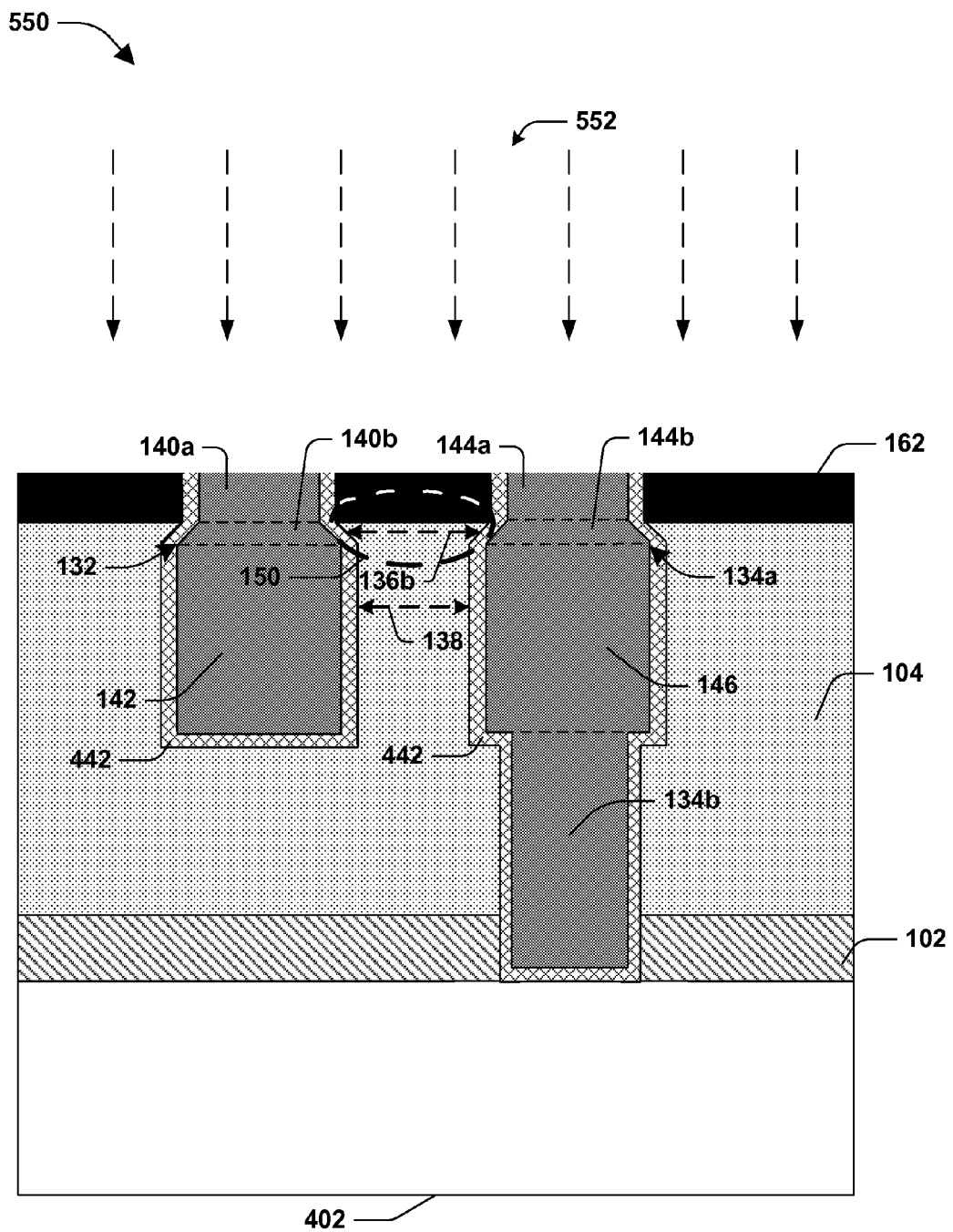
FIG. 5B is an illustration of one or more kinked structures of an interconnect structure, according to some embodiments.

In some embodiments, a CMP process 552 is performed to remove conductive material formed over the cap layer 422, resulting in removal of a portion of the cap layer 442 to create the cap layer 162, as illustrated by example 550 of FIG. 5B. In this example, the first kinked structure 132 comprises a first tapered neck portion 140b and a first non-tapered neck portion 140a that is situated over the first tapered neck portion 140b. The second kinked structure 134a comprises a second tapered neck portion 144b and a second non-tapered neck portion 144a that is situated over the second tapered neck portion 144b. In an example, the first non-tapered neck portion 140a and the second non-tapered neck portion 144a are situated substantially within the cap layer 162.

Figure 5C:
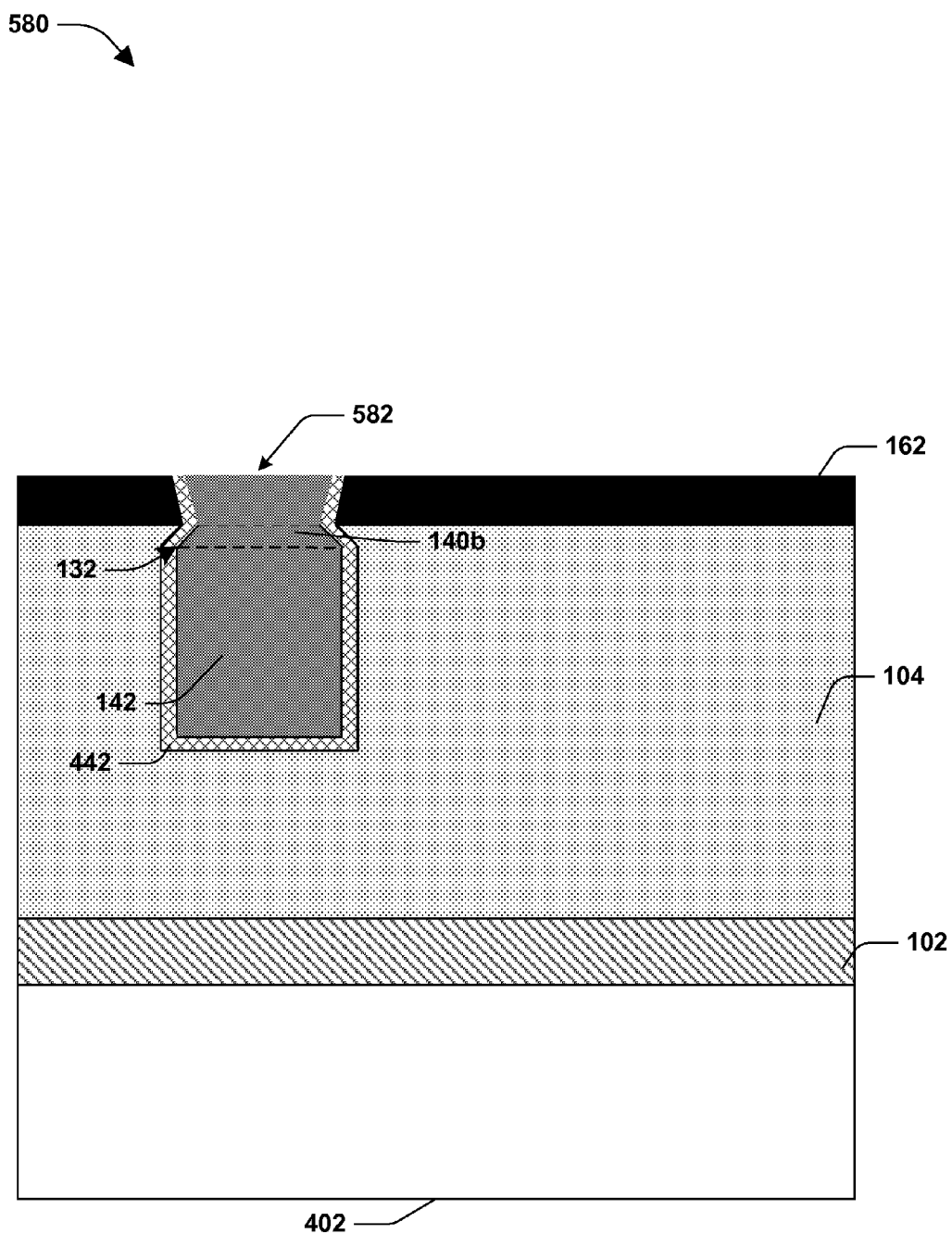
FIG. 5C is an illustration of a kinked structure of an interconnect structure, according to some embodiments.
Figure 5D:
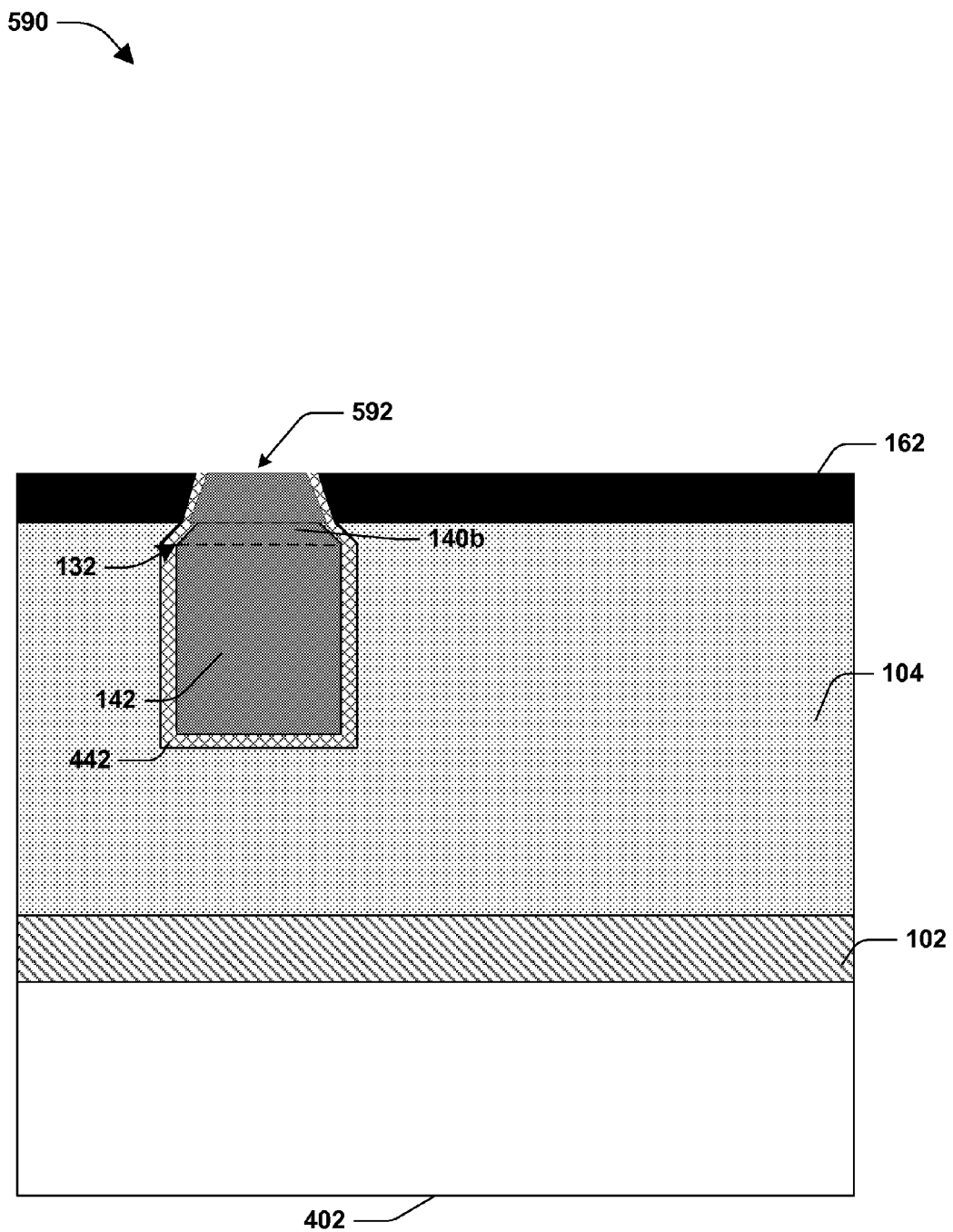
FIG. 5D is an illustration of a kinked structure of an interconnect structure, according to some embodiments.

In some embodiments, the first kinked structure 132 comprises a top neck portion 582 formed over the first tapered neck portion 140b, as illustrated in example 580 of FIG. 5C. The top neck portion 582 has an inverse tapered shaped with respect to a tapered shape of the first tapered neck portion 140b such that a narrow portion of the top neck portion 582 is formed on top of a narrow portion of the first tapered neck portion 140b. For example, the top neck portion 582 is relatively wider at the top and relatively narrower at the bottom. In some embodiments, the first kinked structure 132 comprises a top neck portion 592 formed over the first tapered neck portion 140b, as illustrated in example 590 of FIG. 5D. The top neck portion 592 has a tapered shaped similar to a tapered shape of the first tapered neck portion 140b such the top neck portion 592 is relatively narrower at the top and relatively wider at the bottom.

Figure 6A:
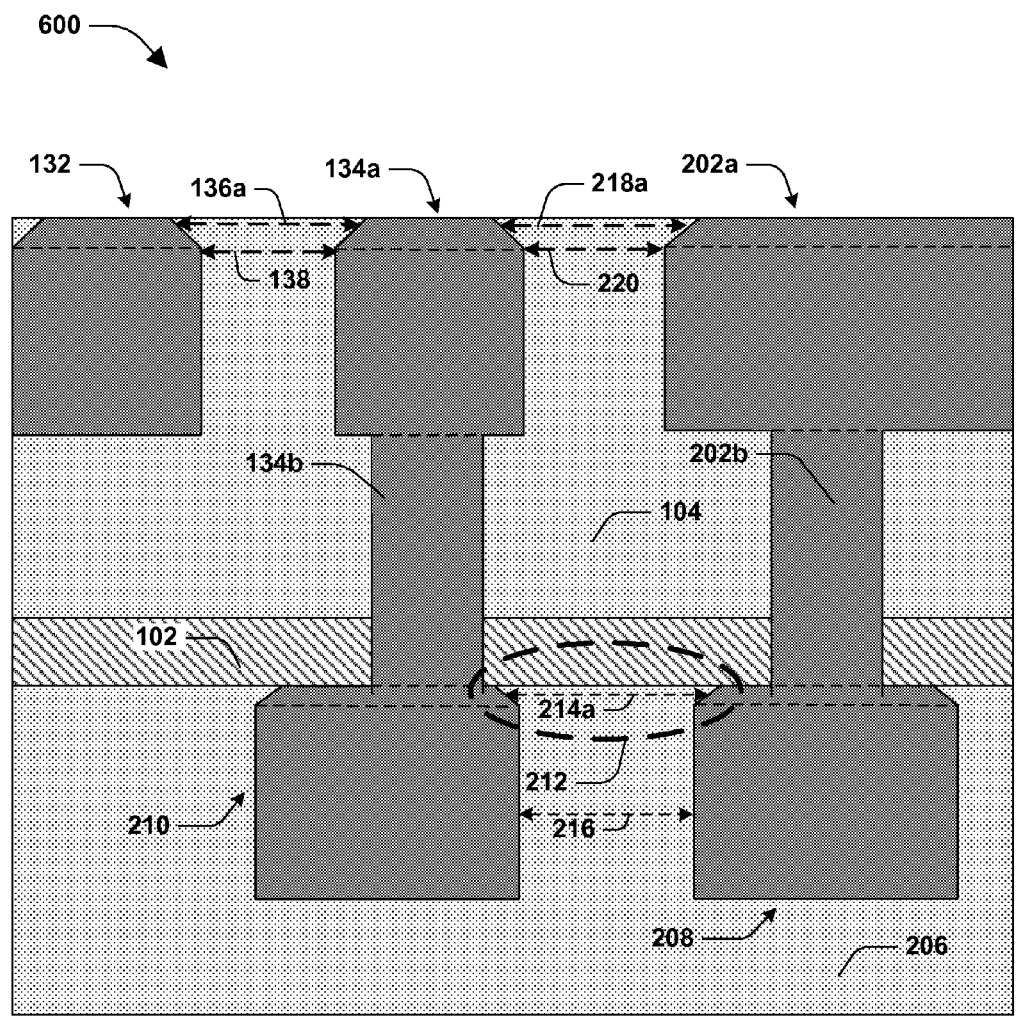
FIG. 6A is an illustration of one or more kinked structures of an interconnect structure, according to some embodiments.
Figure 6B:
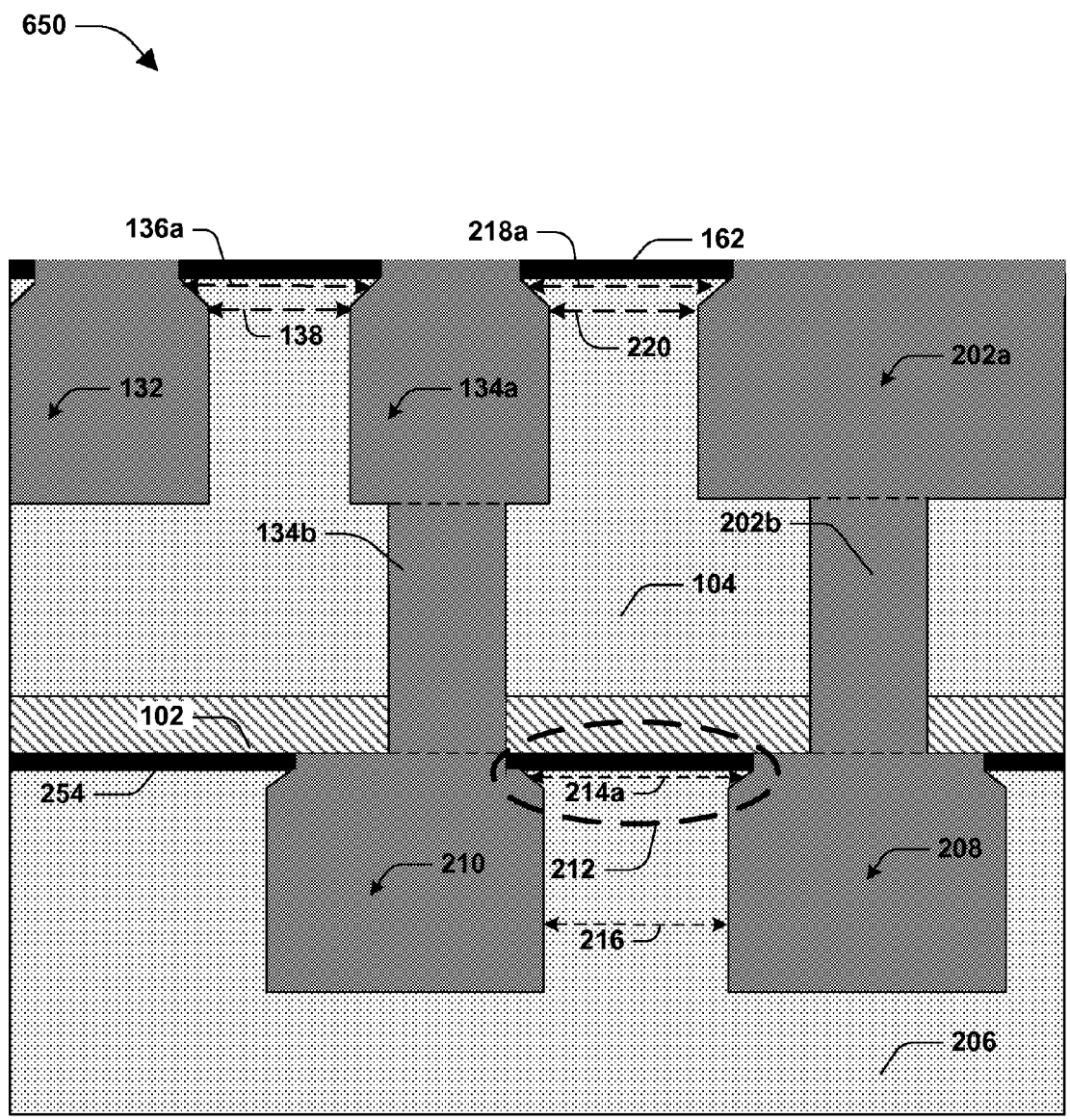
FIG. 6B is an illustration of one or more kinked structures of an interconnect structure, according to some embodiments.

FIG. 6A illustrates an example of an interconnect structure 600 for an integrated circuit. The interconnect structure 600 comprises a first kinked structure 132, a second kinked structure 134a, and a third kinked structure 202a within a first layer. A first via structure 134b within the first layer connects the second kinked structure 134a to a fourth kinked structure 210 within a second layer. A second via structure 202b within the first layer connects the third kinked structure 202a to a fifth kinked structure 208 within the second layer.

A first distance 136a between a first neck portion of the first kinked structure 132 and a second neck portion of the second kinked structure 134a is larger than a second distance 138 between a first body portion of the first kinked structure 132 and a second body portion of the second kinked structure 134a. A third distance 218a between the second neck portion of the second kinked structure 134a and a third neck portion of the third kinked structure 202a is larger than a fourth distance 220 between the second body portion of the second kinked structure 134a and a third body portion of the third kinked structure 202a. A fifth distance 214a between a fourth neck portion of the fourth kinked structure 210 and a fifth neck portion of a fifth kinked structure 208 is larger than a sixth distance 216 between a fourth body portion of the fourth kinked structure 210 and a fifth body portion of the fifth kinked structure 208.

Because the neck portions of the kinked structures have a tapered shape, lengths of interfaces between layers may be relatively larger than if the kinked structures were formed merely according to a non-tapered shape, such as the non-tapered shape of the body portions of the kinked structures. For example, an interface 212 between a second dielectric layer 206 and a second layer 102, such as an etch stop layer formed between the second dielectric layer 206 and a dielectric layer 104, may have a length corresponding to the distance 214a between the fourth neck portion of the fourth kinked structure 210 and the fifth neck portion of the fifth kinked structure 208. The distance 214a is relatively larger than a distance 216 between the fourth body portion of the fourth kinked structure 210 and the fifth body portion of the fifth kinked structure 208. Increasing the length of the interface 212 can mitigate current leakage at the interface 212. In some embodiments, the interface 212 is associated with a cap layer 254 between the second dielectric layer 206 and the second layer 102, as illustrated in example 650 of FIG. 6B. The cap layer 254 can aid in forming the tapered shape for the kinked structures. In an example, the cap layer 254 corresponds to a remaining portion of a cap layer not completely removed by a CMP process.

According to an aspect of the instant disclosure, an interconnect structure, for an integrated circuit, having a kinked profile is provided. The interconnect structure comprises a first kinked structure formed within a dielectric layer of the integrated circuit. The first kinked structure comprises a first neck portion and a first body portion. The first neck portion has a first neck width that is less than a first body width of the first body portion. The first neck portion comprises a first tapered portion situated at an interface between the dielectric layer and a layer overlying the dielectric layer.

According to an aspect of the instant disclosure, an interconnect structure, for an integrated circuit, having a kinked profile is provided. The interconnect structure comprises a first kinked structure formed within a dielectric layer of the integrated circuit. The first kinked structure comprises a first neck portion and a first body portion. The interconnect structure comprises a second kinked structure formed within the dielectric layer and adjacent to the first kinked structure. The second kinked structure comprises a second neck portion and a second body portion. A first distance between the first neck portion and the second neck portion is larger than a second distance between the first body portion and the second body portion.

According to an aspect of the instant disclosure, a method for forming an interconnect structure, for an integrated circuit, having a kinked profile. The method comprises, forming a first trench opening within the dielectric layer. The first trench opening has a first trench tapered portion. A first kinked structure is formed within the first trench opening. The first kinked structure comprises a first neck portion and a first body portion. The first neck portion has a first neck width that is less than a first body width of the first body portion. The first neck portion comprises a first tapered portion situated at an interface between the dielectric layer and a layer formed over the dielectric layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. An interconnect structure, comprising:
   a first kinked structure situated within a dielectric layer and extending through a cap layer situated over the dielectric layer, the first kinked structure comprising:
   a first body portion situated within the dielectric layer and having a first body width; and
   a first neck portion situated within the dielectric layer and within the cap layer, wherein:
      a first neck width of the first neck portion at an interface between the first body portion and the first neck portion is greater than a second neck width of the first neck portion at a top surface of the cap layer,
      the first neck portion defines a tapered, linearly-sloping sidewall,
      a first portion of the tapered, linearly-sloping sidewall is laterally co-planar with the dielectric layer,
      a second portion of the tapered, linearly-sloping sidewall is laterally co-planar with the cap layer, and
      the first portion of the tapered, linearly sloping sidewall and the second portion of the tapered, linearly-sloping sidewall have a same slope;
   an etch stop layer situated over the cap layer; and
   a via portion situated within the etch stop layer and overlying the first kinked structure, wherein:
      the via portion interfaces with the first neck portion to define a first interface,
      a plane in which a sidewall of the via portion lies is substantially parallel to a plane in which a sidewall of the first body portion lies, and
      the plane in which the sidewall of the via portion lies is not co-planar with the plane in which the sidewall of the first body portion lies.

2. The interconnect structure of claim 1, the first kinked structure comprising at least one of a metal structure or a via structure.

3. The interconnect structure of claim 1, comprising:
   a second kinked structure comprising a second neck portion situated within the dielectric layer and within the cap layer and a second body portion situated within the dielectric layer.

4. The interconnect structure of claim 3, a first distance between the first neck portion and the second neck portion greater than a second distance between the first body portion and the second body portion.

5. The interconnect structure of claim 1, wherein:
   the cap layer interfaces with the etch stop layer to define a second interface, and
   the second interface is laterally co-planar with the first interface.

6. The interconnect structure of claim 1, the first kinked structure extending through the dielectric layer from a top surface of the dielectric layer to a bottom surface of the dielectric layer.

7. The interconnect structure of claim 1, the first kinked structure extending from a top surface of the dielectric layer to a region in the dielectric layer above a bottom surface of the dielectric layer.

8. An interconnect structure comprising:
a first kinked structure comprising:
- a first body portion situated within a dielectric layer; and
- a first neck portion situated within the dielectric layer and within a cap layer situated over the dielectric layer, wherein:
  - the first neck portion has a first linearly-sloping tapered portion situated within the dielectric layer,
  - the first neck portion has a second linearly-sloping tapered portion situated within the cap layer, and
  - the first linearly-sloping tapered portion has a first slope and the second linearly-sloping tapered portion has a second slope opposite in polarity to the first slope; and
a via portion situated within an etch stop layer situated over the cap layer, wherein a plane in which a sidewall of the via portion lies is substantially parallel to a plane in which a sidewall of the first body portion lies.

9. The interconnect structure of claim 8, wherein:
the via portion interfaces with the second linearly-sloping tapered portion to define a first interface,
the cap layer interfaces with the etch stop layer to define a second interface, and
the second interface is laterally co-planar with the first interface.

10. The interconnect structure of claim 8, wherein the cap layer overlies the first linearly-sloping tapered portion.

11. The interconnect structure of claim 8, wherein the dielectric layer interfaces with the cap layer to define an interface.

12. The interconnect structure of claim 8, wherein the plane in which the sidewall of the via portion lies is not co-planar with the plane in which the sidewall of the first body portion lies.

13. The interconnect structure of claim 8, wherein the first body portion is non-tapered.

14. The interconnect structure of claim 8, wherein the via portion is non-tapered.

15. An interconnect structure comprising:
a first kinked structure comprising:
- a first body portion situated within a dielectric layer; and
- a first neck portion situated within the dielectric layer and within a cap layer situated over the dielectric layer, wherein:
  - the first neck portion has a first linearly-sloping tapered portion situated within the dielectric layer,
  - the first neck portion has a second linearly-sloping tapered portion situated within the cap layer, and
  - the first linearly-sloping tapered portion has a first slope and the second linearly-sloping tapered portion has a second slope opposite in polarity to the first slope; and
a non-tapered via portion situated within an etch stop layer situated over the cap layer, wherein the non-tapered via portion overlies the first kinked structure.

16. The interconnect structure of claim 15, wherein a plane in which a sidewall of the non-tapered via portion lies is substantially parallel to a plane in which a sidewall of the first body portion lies.

17. The interconnect structure of claim 15, wherein the cap layer overlies the first linearly-sloping tapered portion.

18. The interconnect structure of claim 15, wherein the dielectric layer interfaces with the cap layer to define an interface.

19. The interconnect structure of claim 15, wherein the first body portion is non-tapered.

20. The interconnect structure of claim 15, wherein the first linearly-sloping tapered portion extends at a constant slope between the first neck portion and the non-tapered via portion.

* * * * *